United States Patent
Nance et al.

(10) Patent No.: US 8,100,043 B1
(45) Date of Patent: Jan. 24, 2012

(54) DETONATOR CARTRIDGE AND METHODS OF USE

(75) Inventors: Christopher J Nance, Middletown, CA (US); Christopher A McKellips, Albertville, MN (US); James D Lucas, Chanhassen, MN (US)

(73) Assignees: Reynolds Systems, Inc., Middletown, CA (US); Alliant Techsystems Inc., Arlington, VA (US)

( * ) Notice: Subject to any disclaimer, the term of this patent is extended or adjusted under 35 U.S.C. 154(b) by 488 days.

(21) Appl. No.: 12/411,762

(22) Filed: Mar. 26, 2009

Related U.S. Application Data (60) Provisional application No. 61/040,235, filed on Mar. 28, 2008.

(51) Int. Cl.
 *F42B 3/10* (2006.01)
(52) U.S. Cl. ............ 86/1.1; 102/202.5; 102/202.9; 102/202.12; 102/202.14
(58) Field of Classification Search .......... 86/1.1; 102/202.5, 202.9, 202.14, 206, 215, 275.11
See application file for complete search history.

(56) References Cited

U.S. PATENT DOCUMENTS

| | | | |
|---|---|---|---|
| 2,415,045 A | | 1/1947 | Seavey |
| 3,608,492 A | * | 9/1971 | Mitchell ............ 102/431 |
| 3,793,920 A | * | 2/1974 | Sheran ............... 86/1.1 |
| 4,869,170 A | | 9/1989 | Dahmberg et al. |
| 5,200,574 A | * | 4/1993 | Cunningham et al. ........ 102/530 |
| 5,204,491 A | * | 4/1993 | Aureal et al. ............ 102/202.14 |
| 5,495,806 A | | 3/1996 | Willey |
| 5,576,509 A | * | 11/1996 | Refouvelet et al. ........ 102/202.7 |
| 5,641,997 A | | 6/1997 | Ohta et al. |
| 5,654,521 A | | 8/1997 | McDaniel |
| 5,929,368 A | | 7/1999 | Ewick et al. |
| 5,969,286 A | * | 10/1999 | Ward et al. ............... 102/202.7 |
| 6,079,332 A | | 6/2000 | Marshall et al. |
| 6,158,347 A | | 12/2000 | Neyer et al. |
| 6,227,115 B1 | | 5/2001 | Gruber et al. |
| 6,230,625 B1 | | 5/2001 | Neyer et al. |
| 6,255,728 B1 | | 7/2001 | Nasiri et al. |
| 6,311,621 B1 | | 11/2001 | Marshall et al. |
| 6,463,857 B1 | | 10/2002 | Schmid et al. |
| 6,467,414 B1 | | 10/2002 | Fisher |
| 6,502,512 B2 | * | 1/2003 | Riviere et al. ............ 102/202.7 |
| 6,591,754 B1 | | 7/2003 | Baur et al. |
| 6,732,655 B1 | | 5/2004 | Jakob et al. |
| 6,753,922 B1 | | 6/2004 | Sengupta et al. |
| 6,915,744 B2 | | 7/2005 | Timizi |
| 6,923,122 B2 | | 8/2005 | Hennings et al. |
| 7,213,518 B2 | * | 5/2007 | Sutcliffe ............... 102/215 |

(Continued)

FOREIGN PATENT DOCUMENTS

JP       01248546      10/1989

*Primary Examiner* — Bret Hayes
*Assistant Examiner* — Joshua Freeman
(74) *Attorney, Agent, or Firm* — Harness, Dickey & Pierce, P.L.C.

(57) ABSTRACT

An energetic material initiation device having a receiver assembly and an initiator assembly that includes an electronic initiator and a pellet assembly with an energetic material. The receiver assembly is configured to be coupled to a firing circuit. When the firing circuit is to be armed, the initiator assembly can be pressed into a socket in the receiver assembly to electrically couple the receiver assembly and the initiator assembly. A method for mounting an energetic material initiation device to a firing circuit is also provided.

20 Claims, 11 Drawing Sheets

U.S. PATENT DOCUMENTS

| | | |
|---|---|---|
| 7,343,859 B2 * | 3/2008 | Matsuda et al. ............. 102/217 |
| 7,430,963 B2 | 10/2008 | Hennings et al. |
| 7,690,303 B2 * | 4/2010 | Reynolds et al. ........ 102/202.14 |
| 2002/0079030 A1 * | 6/2002 | Chan et al. ...................... 149/11 |
| 2002/0166471 A1 | 11/2002 | Goernig et al. |
| 2002/0178956 A1 | 12/2002 | Mattes et al. |
| 2003/0183110 A1 * | 10/2003 | Brede et al. ............. 102/202.14 |
| 2003/0200890 A1 | 10/2003 | Reynolds et al. |
| 2004/0083919 A1 | 5/2004 | Hosey et al. |
| 2004/0107856 A1 | 6/2004 | Hennings et al. |
| 2005/0126419 A1 * | 6/2005 | Johnson ........................ 102/308 |
| 2005/0235858 A1 | 10/2005 | Reynolds et al. |
| 2007/0261583 A1 | 11/2007 | Nance |
| 2007/0261584 A1 | 11/2007 | Nance et al. |
| 2008/0134921 A1 | 6/2008 | Nance |
| 2008/0148982 A1 | 6/2008 | Hennings et al. |
| 2009/0056584 A1 | 3/2009 | Hennings et al. |

* cited by examiner

DETONATOR CARTRIDGE AND METHODS OF USE

CROSS-REFERENCE TO RELATED APPLICATIONS

This application claims the benefit of U.S. Provisional Patent Application No. 61/040,235 filed Mar. 28, 2008 and entitled "Detonator Cartridge", the disclosure of which is hereby incorporated by reference as if set forth herein in its entirety.

INTRODUCTION

The present disclosure generally relates to an energetic material initiation device and, more particularly, to a modular energetic material initiation device having an initiator assembly that can be moved into a receiver that is electrically coupled to a firing circuit to mechanically and electrically couple the initiator assembly to the firing circuit.

The invention of various energetic materials, such as secondary explosives, and improved electronic initiators, such as exploding foil initiators, has greatly improved the reliability and safety of devices that employ an energetic material initiation device. Such energetic material initiation devices typically employ a firing circuit for generating or transmitting an electrical input to an electronic initiator to initiate a detonation event in a charge of a secondary explosive. For purposes of this discussion and the appended claims, the firing circuit is considered to be armed when an electronic initiator and a charge of an energetic material are coupled to the firing circuit. Despite these advance, additional safety measures and precautions are typically employed once a firing circuit has been armed.

Conventional energetic material initiation devices typically employ a common housing for holding both the electronic initiator and the energetic material. As the terminals of the electronic initiator are typically soldered to the firing circuit, the firing circuit usually had to be armed at a relatively early stage in the assembly of the device that employed the energetic material initiation device.

We have noted, however, that it would be desirable to arm a firing circuit as one of the last steps in the fabrication of a device that employs an energetic material initiation device.

SUMMARY

In one form the present teachings provide a method for mounting an energetic material initiation device to a firing circuit with a circuit board. The method includes: providing a receiver assembly with a receiver, and a plurality of receiver terminals, the receiver including a base and an upstanding wall member, the base and the upstanding wall member cooperating to form a socket, the upstanding wall member defining a first insertion guide and a first locking member, the receiver terminals extending through at least one of the base and the upstanding wall member; providing an initiator assembly with an initiator housing, an electronic initiator, a pellet assembly and a plurality of initiator terminals, the initiator housing defining a recess into which the pellet assembly is received, the initiator housing including a second insertion guide and a second locking member, the electronic initiator being at least partially encapsulated into the initiator housing, the initiator terminals being electrically coupled to the electronic initiator and extending through the initiator housing, the pellet assembly including an energetic material; electrically coupling the receiver terminals to corresponding arming terminals on the circuit board when the pellet assembly is not disposed in the socket; aligning the initiator assembly to the socket such that the first and second insertion guides are engaged to one another; and electrically coupling the electronic initiator to the arming terminals solely by pushing the initiator assembly into the socket such that the first and second locking members are lockingly engaged to one another and the initiator terminals are electrically engaged to the receiver terminals.

In another form, the present teachings provide an energetic material initiation device that includes a receiver assembly and an initiator assembly. The receiver assembly includes a receiver and a plurality of receiver terminals. The receiver includes a base and an upstanding wall member that cooperate to form a socket. The upstanding wall member defines a first insertion guide and a first locking member. The receiver terminals extend through at least one of the base and the upstanding wall member. The initiator assembly is received in the socket and includes an initiator housing, an electronic initiator, a pellet assembly and a plurality of initiator terminals. The initiator housing defines a recess into which the pellet assembly is received. The initiator housing includes a second insertion guide and a second locking member. The electronic initiator is at least partially encapsulated into the initiator housing. The initiator terminals are electrically coupled to the electronic initiator and extend through the initiator housing. The pellet assembly includes an energetic material. The first and second insertion guides are engaged to one another to align the initiator assembly to the socket. The first and second locking members engage one another to inhibit the initiator assembly from being withdrawn from the socket. The receiver terminals resiliently engage the initiator terminals to electrically couple the electronic initiator and the receiver terminals.

Further areas of applicability will become apparent from the description provided herein. It should be understood that the description and specific examples are intended for purposes of illustration only and are not intended to limit the scope of the present disclosure, its application and/or uses in any way.

BRIEF DESCRIPTION OF THE DRAWINGS

The drawings described herein are for illustration purposes only and are not intended to limit the scope of the present disclosure in any way. Similar or identical elements are given consistent identifying numerals throughout the various figures.

DETAILED DESCRIPTION OF THE VARIOUS EMBODIMENTS

Figure 1:
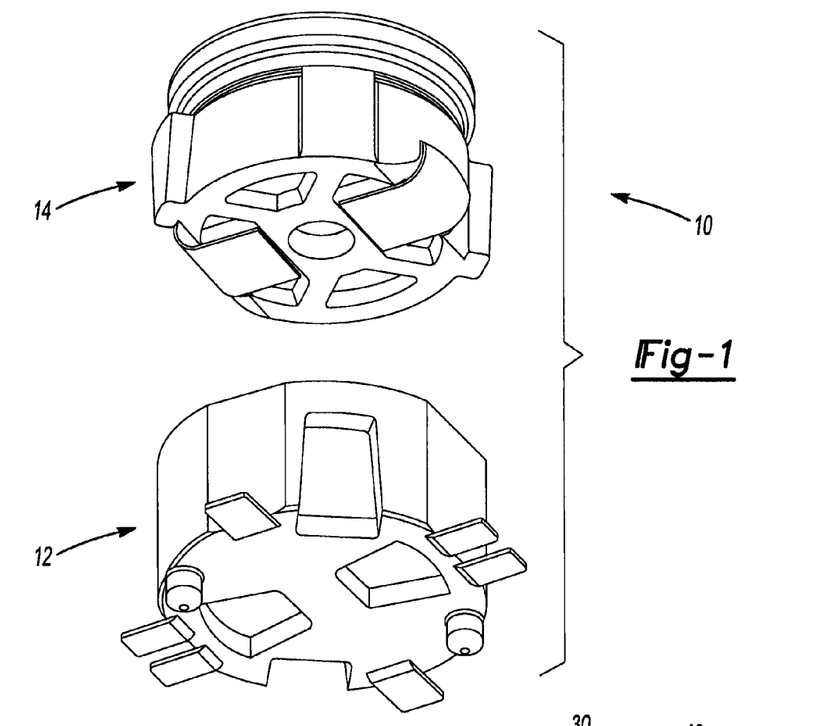
FIG. 1 is an exploded perspective view of an energetic material initiation device constructed in accordance with the teachings of the present disclosure.
Figure 2:
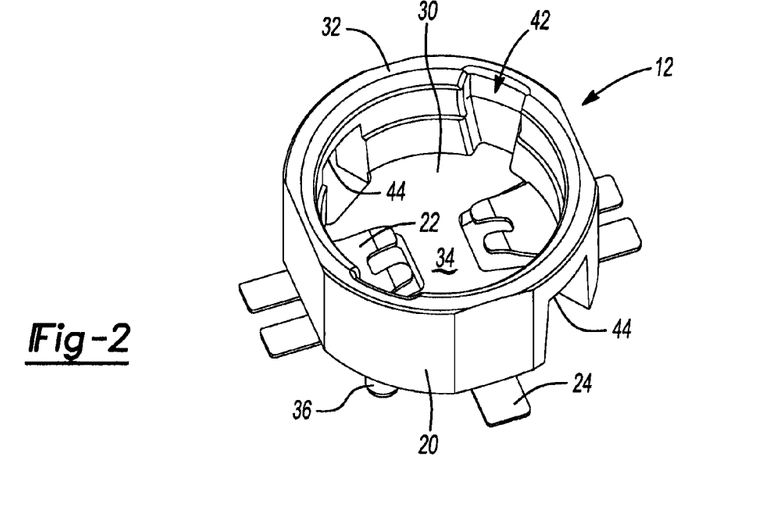
FIG. 2 is a perspective view of a portion of the energetic material initiation device of FIG. 1 illustrating the receiver assembly in more detail.

With reference to FIG. 1 of the drawings, an energetic material initiation device is generally indicated by reference numeral 10. The energetic material initiation device 10 can include a receiver assembly 12 and an initiator assembly 14.

With reference to FIGS. 2 through 6, the receiver assembly 12 can include a housing or receiver 20, a plurality of receiver terminals 22 and a plurality of anchoring terminals 24. The receiver 20 can be formed of a suitable material, such as liquid crystal polymer (LCP) plastic and can include a base 30 and an upstanding wall member 32 that can cooperate to form a socket 34. A first locating element 36 can be coupled to the base 30 on a side opposite the socket 34. The first locating element 36 can include a plurality of male locating members, such as a stem that can have a cylindrical body 38 and a spherical end 40. Alternatively, the first locating element 36 could comprise one or more apertures that could be formed into the base 30 on a side opposite the socket 34. The socket 34 can be shaped in any desired manner but in the particular example provided is generally cylindrical. The upstanding wall member 32 can define a first insertion guide 42 and a first locking member 44.

Figure 3:
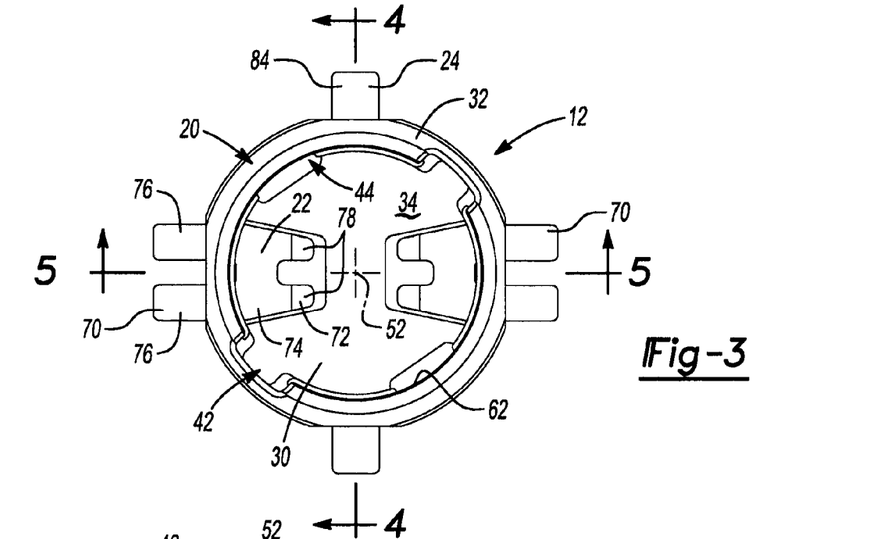
FIG. 3 is a top plan view of the receiver assembly.
Figures 4, 5:
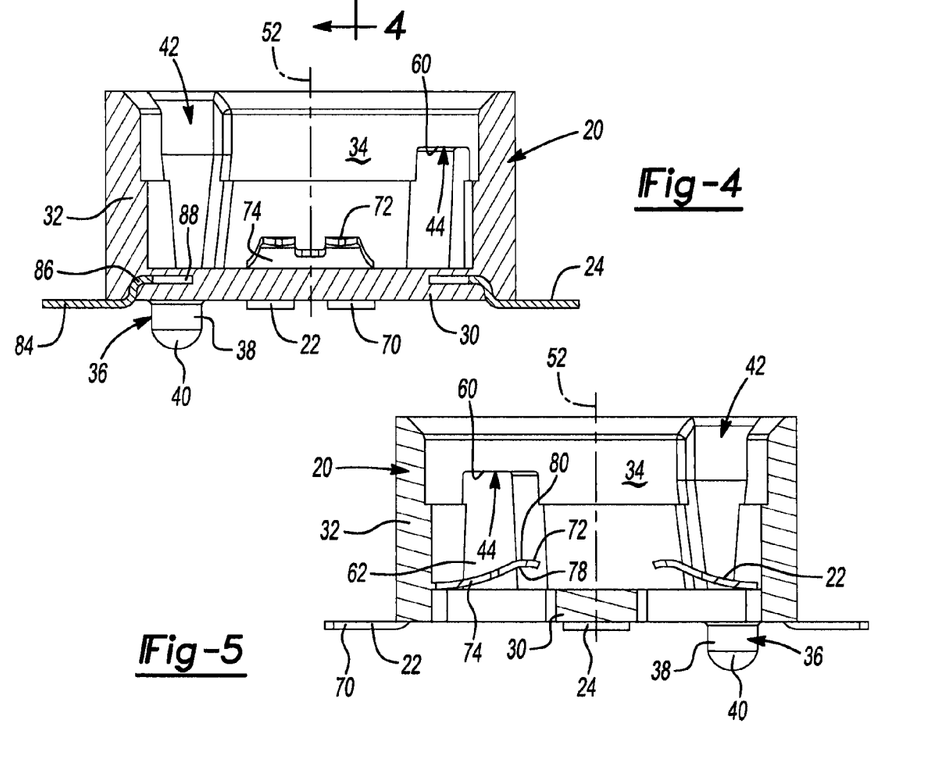
FIG. 4 is a section view taken along the line 4-4 of FIG. 3.
FIG. 5 is a section view taken along the line 5-5 of FIG. 3.
Figure 6:
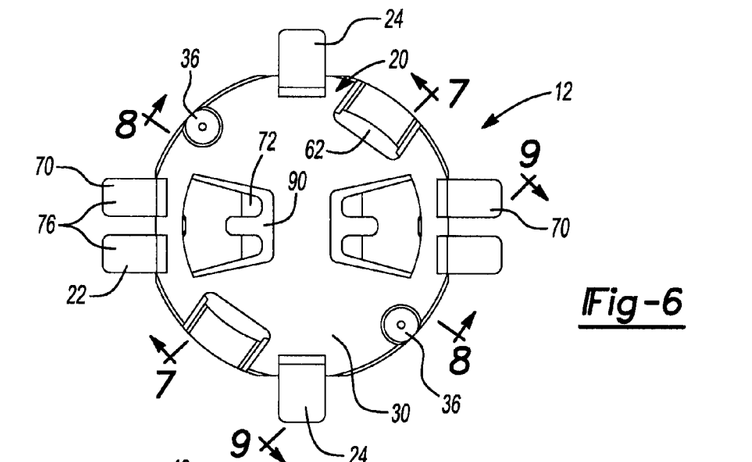
FIG. 6 is a bottom view of the receiver assembly.
Figure 7:
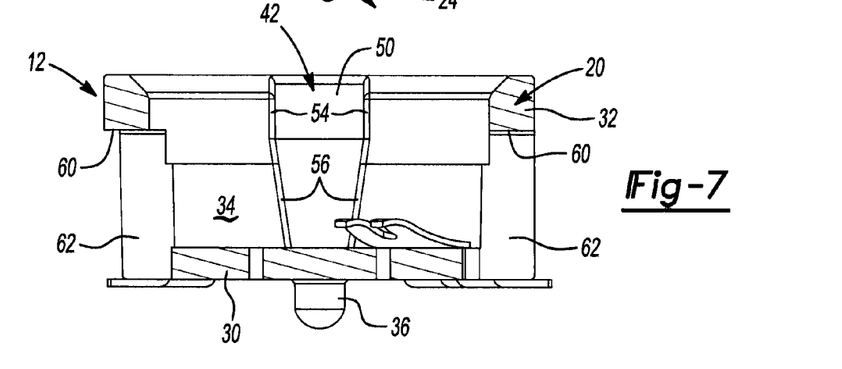
FIG. 7 is a section view taken along the line 7-7 of FIG. 6.
Figure 8:
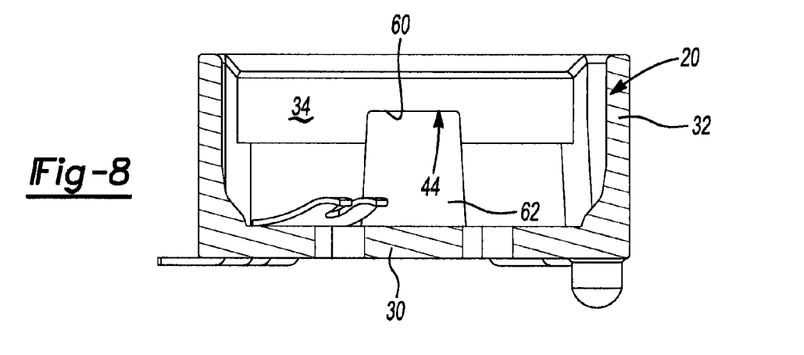
FIG. 8 is a section view taken along the line 8-8 of FIG. 6.
Figure 9:
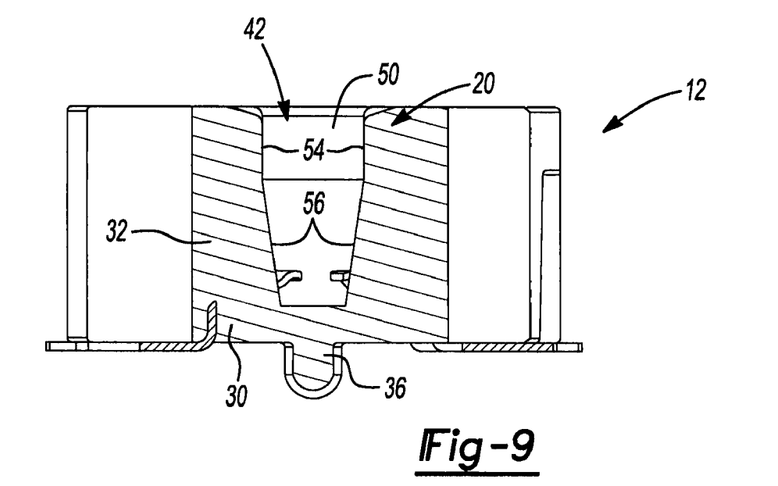
FIG. 9 is a section view taken along the line 9-9 of FIG. 6.

With reference to FIGS. 3, 7 and 9, the first insertion guide 42 can include one or more grooves 50 that can extend generally parallel to a central axis 52 of the socket 34. In the example provided, the first insertion guide 42 includes a pair of grooves 50 that are disposed 180 degrees apart from one another such that each of the grooves 50 is disposed between one of the receiver terminals 22 and one of the anchoring terminals 24. Each groove 50 can include a pair of opposite sidewalls 54. At least a portion 56 of one of the sidewalls 54 can taper inwardly toward one the other one of the sidewalls 54 as the sidewalls 54 approach the base 30 of the receiver 20. In the example provided, both of the sidewalls 54 of each groove 50 include a portion 56 that tapers inwardly toward the other one of the sidewalls 54 as the sidewalls 54 approach the base 30 of the receiver 20.

With reference to FIGS. 3, 5, 7 and 8, the first locking member 44 can include one or more abutting walls 60 that can extend about a portion of the perimeter of the socket 34. In the particular example provided, a pair of abutting walls 60 is employed and each of the abutting walls 60 is formed by a cavity 62 that extends through the base 30 and the upstanding wall member 32 of the receiver 20. The abutting walls 60 can be disposed generally perpendicular to the central axis 52 of the socket 34.

Figures 20, 21, 22:
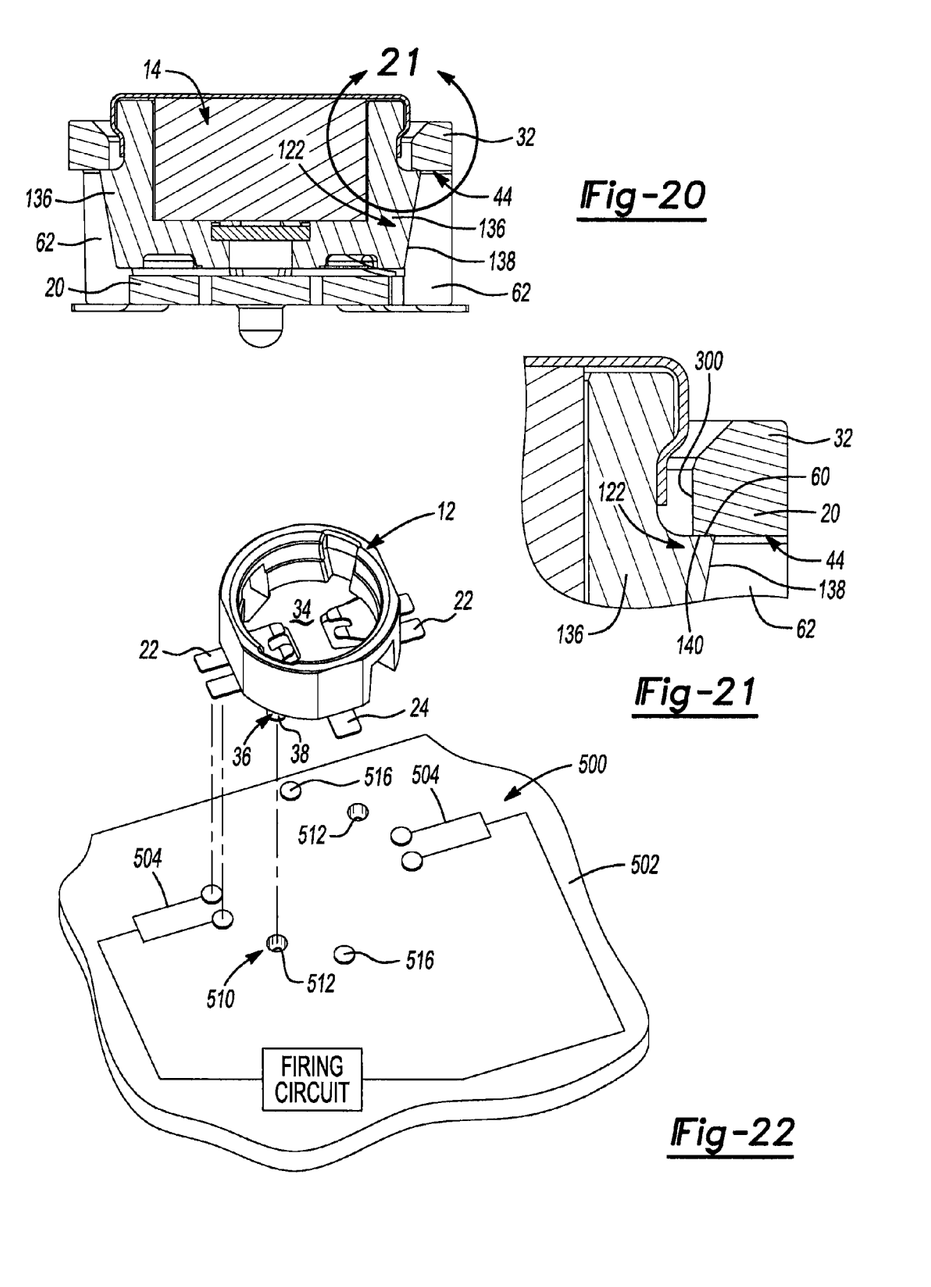
FIG. 20 is a section view taken along the line 20-20 of FIG. 14.
FIG. 21 is an enlarged portion of FIG. 20.
FIG. 22 is an exploded perspective view of the receiver assembly and a firing circuit.
Figure 23:
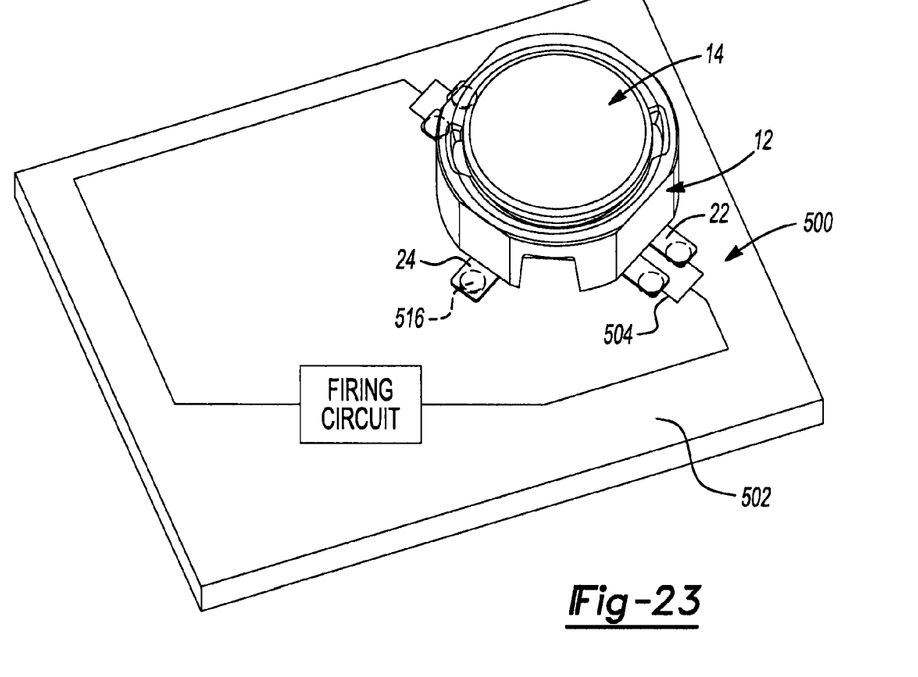
FIG. 23 is a perspective view of the energetic material initiation device of FIG. 1 as coupled to a firing circuit.

With reference to FIGS. 2 and 4 through 6, the receiver terminals 22 can be formed of a suitable material, such as beryllium copper plated with nickel and gold, and can extend through the receiver 20 (i.e., through the base 30 and/or the upstanding wall member 32). Each of the receiver terminals 22 can include a first end 70, a second, opposite end 72 and an intermediate portion 74 between the first and second ends 70 and 72. The first end 70 can be disposed outside the receiver 20 and can be configured to be electrically coupled to a corresponding arming terminal 504 (FIG. 22) of a firing circuit 500 (FIG. 22). In the example provided, the first end 70 includes a pair of spaced-apart members 76 that provide both a redundant electrical path between the arming terminal 504 (FIG. 22) and the intermediate portion 74 of the receiver terminal 22 as well as a relatively large surface area that can aid in securely mounting the receiver assembly 12 to the firing circuit 500 (FIG. 22). The second end 72 can be disposed inside the socket 34 and can include a pair of spaced-apart members 78 that can have a generally convex upper contact surface 80. The intermediate portion 74 can be encapsulated into the material that forms the receiver 20 and can resiliently bias the second end 72 in a direction outwardly away from the base 30.

The anchoring terminals 24 can be formed of the same material as the receiver terminals 22, or could be formed from a different material. The anchoring terminals 24 include an outer end 84 that can extend outwardly from the receiver 20 and an inward end 86 that can be molded into the material that forms the receiver 20. In the particular example provided, the anchoring terminals 24 are formed in a flattened "Z" shape and include an anchoring aperture 88 in their inward ends 86. The inward ends 86 can be molded into the base 30 of the receiver 20 (i.e., the inward ends 86 can be encapsulated into the material that forms the base 30 of the receiver 20) such that the material that forms the receiver 20 is disposed through the anchoring apertures 88. The outer ends 84 of the anchoring terminals 24 can be coupled to the firing circuit 500 (FIG. 22) to further secure the receiver assembly 12 to the firing circuit 500 (FIG. 22). Suitable means for coupling the anchoring terminals 24 to the firing circuit 500 can include soldering, brazing, welding, mechanical fastening (e.g., threaded fasteners, clamps) and adhesives.

Those of skill in the art will appreciate from this disclosure that the receiver 20 can be injection molded onto the receiver terminals 22 and the anchoring terminals 24 so that the receiver terminals 22 and the anchoring terminals 24 are partially encapsulated in the receiver 20. The particular configuration of the receiver 20 illustrated can be formed with an injection mold having first and second mold tools that do not employ movable tooling elements within the first and second mold tools. In this regard, the first mold tool (not shown) can be equipped with a first set of posts (not shown), which can be employed to form the cavities 62 and the abutting walls 60 of the first locking member 44, and a second set of posts (not shown), which can be employed to support the portion of the receiver terminals 22 that is disposed within the socket 34, while the second mold tool (not shown) can be equipped with a third set of posts (not shown), which can be employed to form the grooves 50 of the first insertion guide 42. It will be appreciated that the second set of posts will define a pair of apertures 90 that extend through the base 30.

Figure 10:
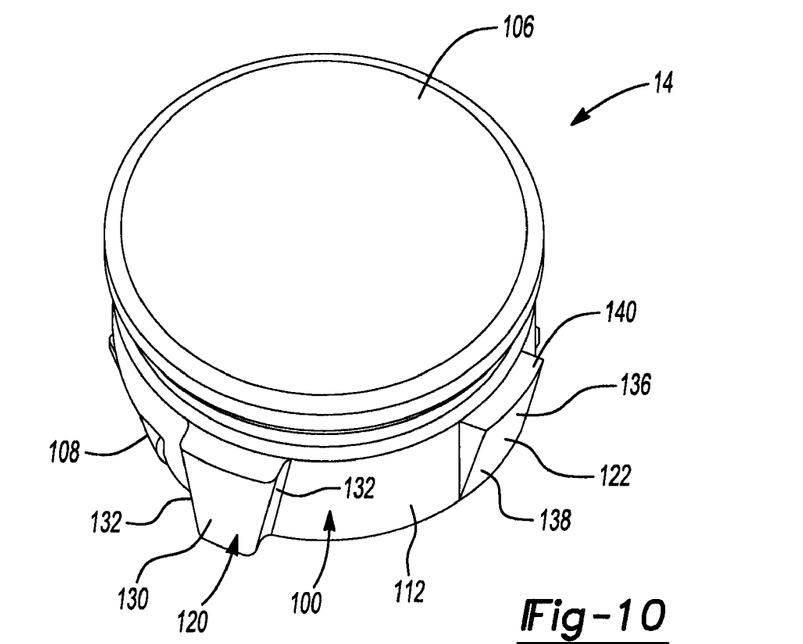
FIG. 10 is a perspective view of a portion of the energetic material initiation device of FIG. 1 illustrating the initiator assembly in more detail.
Figure 11:
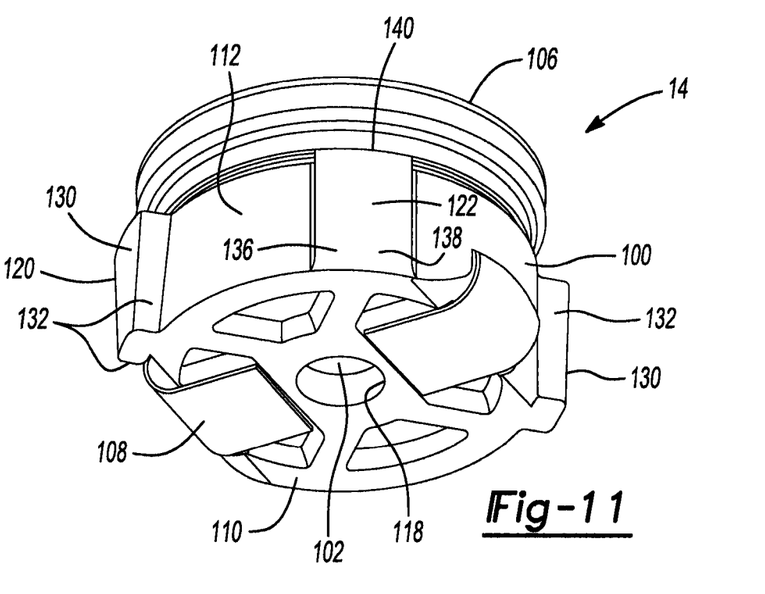
FIG. 11 is a perspective view of the initiator assembly.
Figure 12:
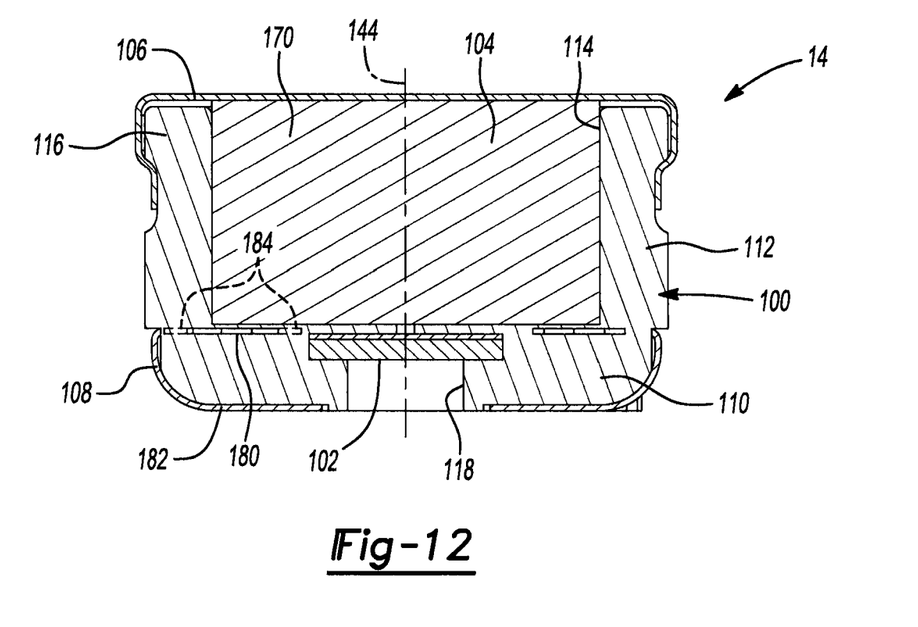
FIG. 12 is a sectional view of the initiator assembly.

With reference to FIGS. 10 through 12, the initiator assembly 14 can include an initiator housing 100, an electronic initiator 102, a pellet assembly 104, a cover member 106 and a plurality of initiator terminals 108.

The initiator housing 100 can be unitarily formed from a suitable material, such as polycarbonate, and can include an initiator base 110 and an initiator sidewall 112 that can cooperate to define a recess 114 into which the pellet assembly 104 can be received. The initiator sidewall 112 can define a flange 116 that can extend about a perimeter of the initiator housing 100 on a side opposite the initiator base 110. A tooling aperture 118 can be formed in the initiator base 110 on a side opposite the recess 114 as a result of the use of a backstop or positioning guide for positioning the electronic initiator 102 in the mold (not shown) that is employed to form the initiator housing 100 and partially (or fully) encapsulate the electronic initiator 102. The initiator sidewall 112 can also define a second insertion guide 120 and a second locking member 122. The second insertion guide 120 can include one or more longitudinally extending ribs 130 that can have lateral sides 132 that are configured to engage the sidewalls 54 (FIG. 9) of the grooves 50 (FIG. 9). Each of the lateral sides 132 of the ribs 130 can be inwardly tapered to match the inwardly tapered portion 56 (FIG. 9) of the sidewalls 54 (FIG. 9) of the grooves 50 (FIG. 9). The second locking member 122 can include one or more projections 136 that are configured to engage the first locking member 44 (FIG. 7). Each of the projections 136 can include an outer longitudinally extending wall 138 and an abutting wall 140. The outer longitudinally extending wall 138 can extend in a direction that is generally parallel to a central axis 144 of the initiator assembly 14 and can taper inwardly with decreasing distance from the initiator base 110. The abutting wall 140 can intersect the outer longitudinally extending wall 138 and can extend in a direction that is generally perpendicular to the central axis 144 of the initiator assembly 14.

The pellet assembly 104 can include a pellet 170 that can be formed of a suitable energetic material, such as a fine particle size secondary explosive. Examples of suitable energetic materials include RSI-007, which may be obtained from Reynolds Systems, Inc. of Middletown, Calif., HNS-IV (hexanitrostilbene), PETN (pentaerithrytol tetranitrate) and NONA (nonanitroterphenyl). Optionally, the pellet assembly 104 can include multiple pellets and/or various structural and/or reactable elements. A pellet assembly having multiple pellets and a structural sleeve is described in co-pending U.S. patent application Ser. No. 10/829,970 entitled "Plastic Encapsulated Energetic Material Initiation Device", the disclosure of which is hereby incorporated by reference as if fully set forth in detail herein, while a pellet assembly having two pellets, a structural sleeve and a reactable member is described in U.S. Pat. No. 6,923,122, the disclosure of which is hereby incorporated by reference as if set forth in detail herein.

The cover member 106 can be abutted against the initiator housing 100 and crimped to the flange 116 or otherwise sealingly engaged to the initiator housing 100 to retain and protect the pellet assembly 104.

Figure 13:
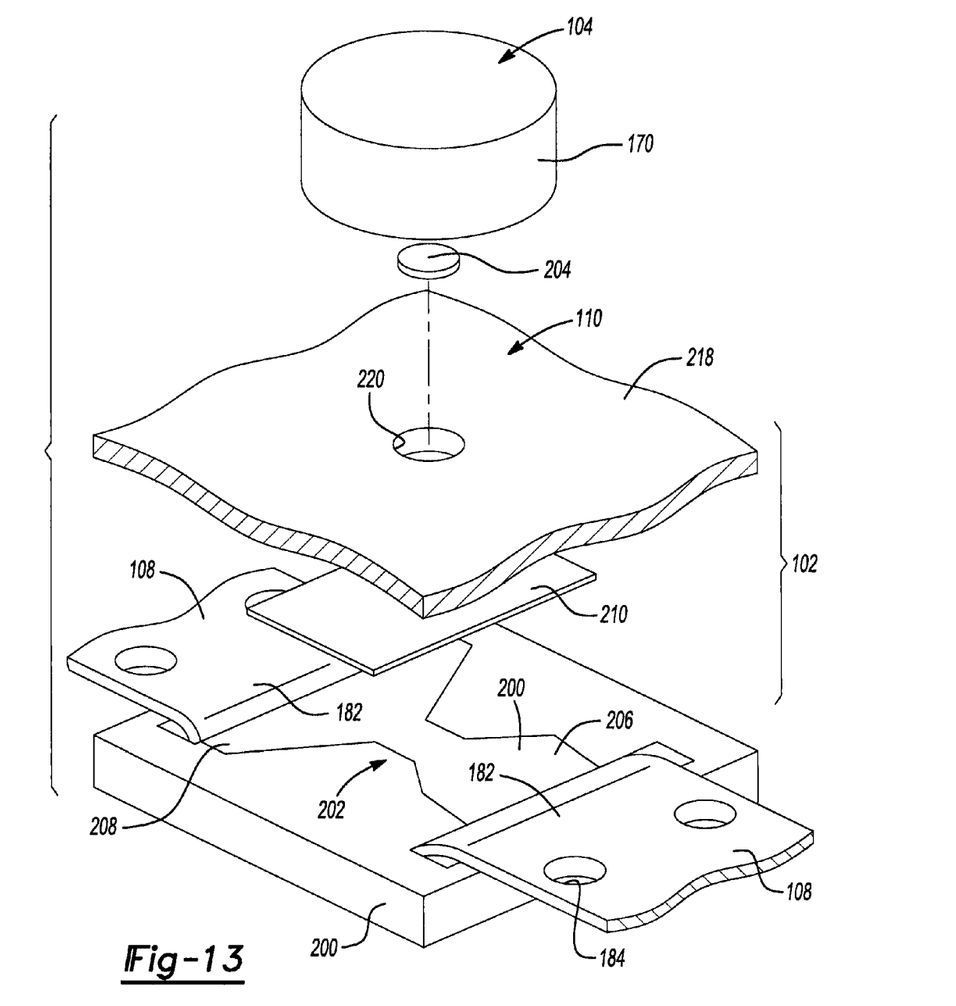
FIG. 13 is an exploded perspective view of a portion of the initiator assembly illustrating the electronic initiator, the barrel, the initiator terminals and the pellet in more detail.
Figure 14:
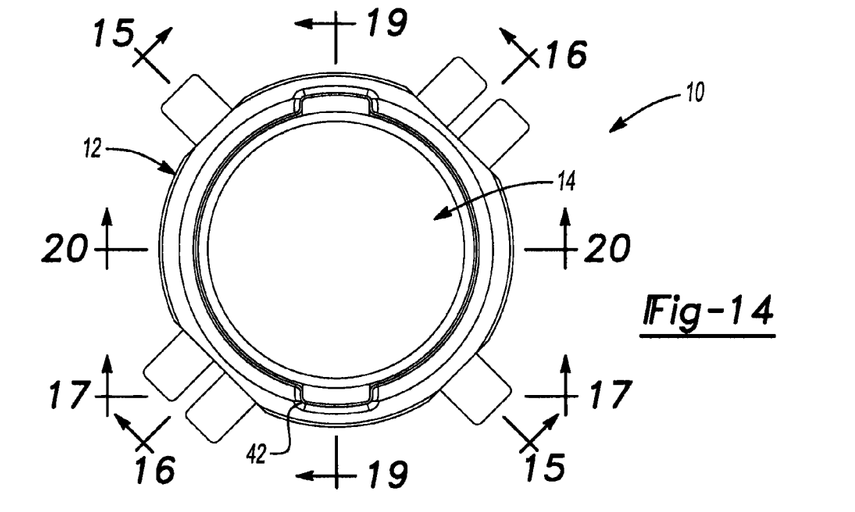
FIG. 14 is a top plan view of the energetic material initiation device of FIG. 1.
Figure 15:
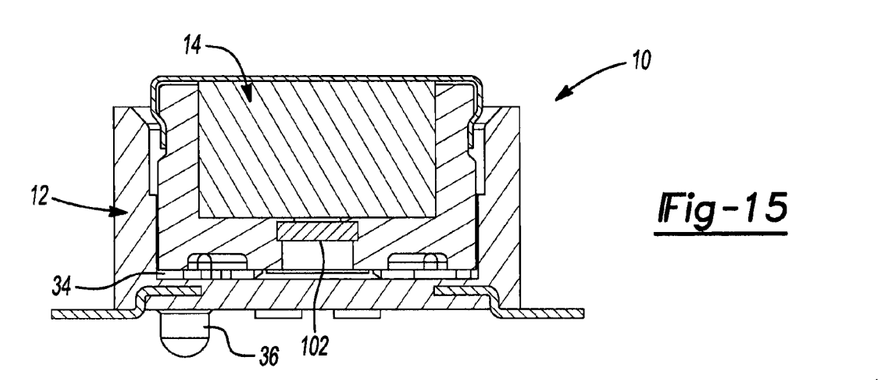
FIG. 15 is a section view taken along the line 15-15 of FIG. 14.
Figure 16:
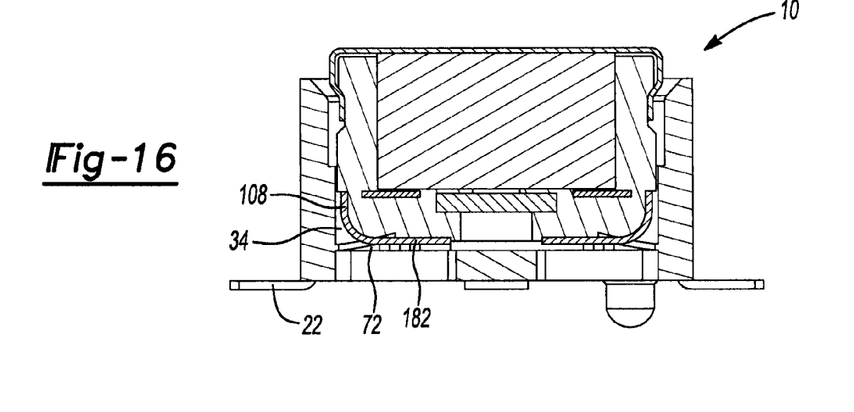
FIG. 16 is a section view taken along the line 16-16 of FIG. 14.
Figure 17:
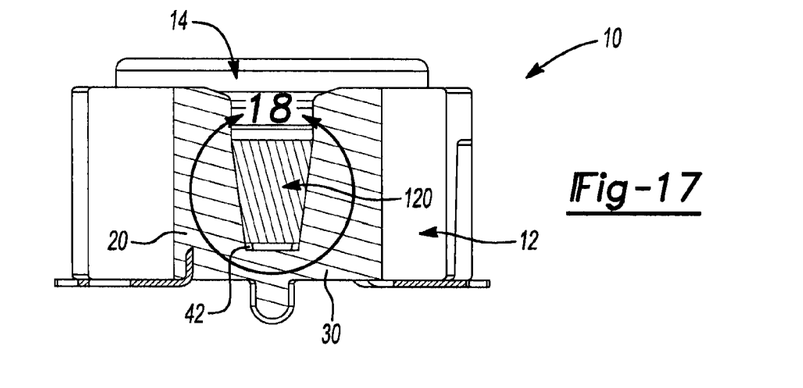
FIG. 17 is a section view taken along the line 17-17 of FIG. 14.
Figures 18, 19:
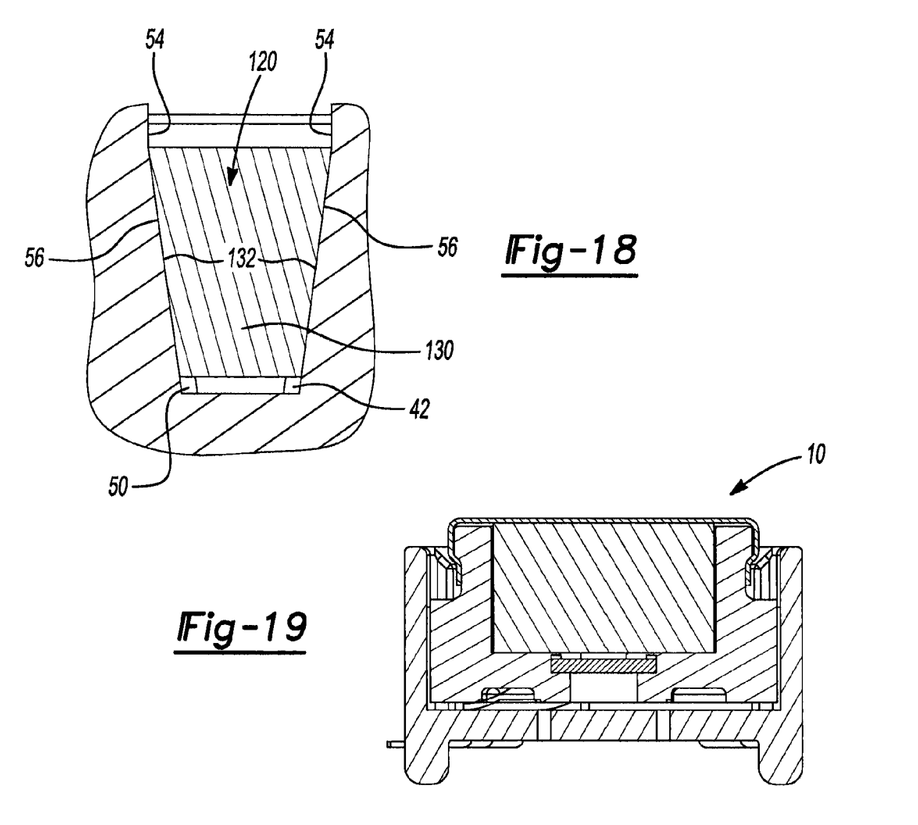
FIG. 18 is an enlarged portion of FIG. 17.
FIG. 19 is a section view taken along the line 19-19 of FIG. 14.

With reference to FIG. 13, the electronic initiator 102 can be any appropriate type of initiator, such as an exploding bridge wire initiator, a squib, a semi-conductor bridge device, or a thin film bridge initiator. In the particular example provided, the electronic initiator 102 is an exploding foil initiator and can include a substrate 200, a bridge 202 and a flyer 204. The substrate 200 can be formed of a ceramic material and can serve as a structural base upon which the bridge 202 and the flyer 204 can be disposed. The bridge 202 can be disposed between the substrate 200 and the flyer 204 and can include with first and second contacts 206 and 208, respectively. A material that is employed to form the flyer 204 can be disposed in a layer 210 over a portion of the bridge 202 and the substrate 200. The exploding foil initiator can include a barrel 218 that can be mounted to the remainder of the exploding foil initiator. As those of skill in the art will appreciate, the barrel 218 can be formed by a discrete layer of material that can be coupled or bonded to a layer of material that is employed to form the flyer 204. The barrel includes a hole 220 through which the flyer 204 is propelled upon activation of the exploding foil initiator. In the example provided, however, the barrel 218 is integrally formed with the initiator base 110 when the electronic initiator 102 is molded into the initiator housing 100. During operation of the electronic initiator 102, electric current is passed through the bridge 202 to cause the conductive material that forms the bridge 202 to vaporize. Vaporization of the bridge creates sufficient pressure to cause the flyer 204 to be sheared from the material layer 210 and to propel the flyer 204 through the hole 220 of the barrel 218 so that it can impact the pellet assembly 104. The shock wave created by the impact of the flyer 204 against the pellet assembly 104 can generate a detonation event in the pellet 170.

With reference to FIGS. 10 through 13, the initiator terminals 108 can be formed of a suitable material, such as a nickel-cobalt ferrous alloy (e.g., KOVAR®) that can be plated with nickel and gold. A first end 180 of the initiator terminals 108 can be electrically coupled (e.g., soldered) to the terminals of the electronic initiator 102 (e.g., to the first and second contacts 206 and 208), while a second end 182 of the initiator terminals 108 can extend through the initiator housing 100. In the particular example provided, the initiator terminals 108 are molded into the initiator housing 100 and include a plurality of anchoring apertures 184 through which the material that forms the initiator housing 100 can flow to thereby further lock the initiator terminals 108 within the initiator housing 100. The second end 182 of the initiator terminals 108 can be bent to wrap around a side of the initiator housing 100 opposite the initiator sidewall 112 after the formation of the initiator housing 100 and simultaneous partial encapsulation of the initiator terminals 108.

With reference to FIGS. 14 through 23, the mounting of the energetic material initiation device 10 to a firing circuit 500 will be described. The firing circuit 500 can include a circuit board 502 with a plurality of arming terminals 504 that can be selectively coupled to a source of electric power (not specifically shown). The receiver assembly 12 can be positioned relative to the circuit board 502 such that the first locating element 36 is aligned to and engages a second locating element 510 on the circuit board 502. In the example provided, the second locating element 510 includes a plurality of holes 512 that are formed in the circuit board 502; the holes 512 are sized to receive the cylindrical bodies 38 to thereby precisely locate the receiver assembly 12 relative to the circuit board 502. The receiver terminals 22 can be electrically coupled (e.g., soldered) to the arming terminals 504 while the socket 34 is empty. The anchoring terminals 24 can also be coupled to the circuit board 502 in a desired manner, such as through an adhesive or by soldering the anchoring terminals 24 to unused contacts 516 on the circuit board 502. The assembly process may halt at this point and the assembly that comprises the firing circuit 500 and the receiver 20 may be stored for future use or incorporated into another device as desired.

When arming of the firing circuit 500 is desired, the initiator assembly 14 can be aligned to the socket 34 such that the first and second insertion guides 42 and 120 are engaged to one another (i.e., in the example provided, the ribs 130 can be aligned between the sidewalls 54 of the grooves 50) and the initiator assembly 14 can be pushed into the socket 34. The mating configuration of the groove 50 and the ribs 130 can precisely guide the initiator assembly 14 in a radial direction as the initiator assembly 14 moves toward the base 30 of the receiver 20. The outer longitudinally extending walls 138 of the projections 136 can engage against the interior surface 300 of the upstanding wall member 32 of the receiver 20 and can urge the upstanding wall member 32 to deflect outwardly to permit the abutting wall 140 to pass beyond the abutting walls 60 and align within the cavities 62. At this point the projections 136 cease to urge the upstanding wall member 32 in an outward direction and the upstanding wall member 32 can spring inwardly such that the abutting walls 60 of the first locking member 44 are disposed in-line with the abutting walls 140 of the second locking member 122. The second ends 72 of the receiver terminals 22 can contact the second ends 182 of the initiator terminals 108 and moreover, the receiver terminals 22 can bias the initiator assembly 34 in a direction outwardly from the socket 34. The abutting walls 60 of the first locking member 44 and the abutting walls 140 of the second locking member 122 can contact one another to limit outward movement of the initiator assembly 14 relative to the receiver assembly 12. From the foregoing, it will be appreciated that the electronic initiator 102 can be electrically coupled to the receiver terminals 22 (and the arming terminals 504) solely by pushing the initiator assembly 14 into the socket 34 such that the first and second locking members 44 and 122 lockingly engage one another.

While the first and second locking members 44 and 122 have been illustrated and described as being permanently engaged to one another, it will be appreciated that the first and second locking members 44 and 122 could be configured to be releasably engaged to one another so that the initiator assembly 14 can be removed from the receiver assembly 12 if desired. For example, the first and second locking members 44 and 122 could be configured to disengage one another in response to application of a pull-out force of a predetermined magnitude to the initiator assembly 14 or through a combination of twisting and pulling. Moreover, while the first and second locking members 44 and 122 have been illustrated and described as locking solely in response to axial movement of the initiator assembly 14 into the socket 34 of the receiver assembly 12, it will be appreciated that the first and second locking members 44 and 122 could additionally or alternatively employ other types of relative movement between the initiator assembly 14 and the receiver assembly 12 and/or between components of the first and second locking members 44 and 122 to lockingly engage the initiator assembly 14 and the receiver assembly 12 to one another. For example, the first and second locking members 44 and 122 could comprise mating male and female threads or a helical track that is engaged by a follower. Moreover, rotational movement of the initiator assembly 14 relative to the receiver assembly 12 by a predetermined amount may be employed to verify that the initiator assembly 14 has been fully seated into the receiver assembly 12. It will also be appreciated from this disclosure that one or both of the first and second locking members 44 and 122 could comprise two or more discrete elements. For example, the first locking member 44 could include a hole (not shown) formed transversely through the receiver 20 and a pin (not shown), while the second locking member 122 could include a hole (not shown) in the initiator housing 100 that is aligned to the hole in the receiver 20; the pin can be received through the hole in the receiver 20 and the hole in the initiator housing 100 to thereby lock the receiver 20 and the initiator housing 100 to one another.

Figure 24:
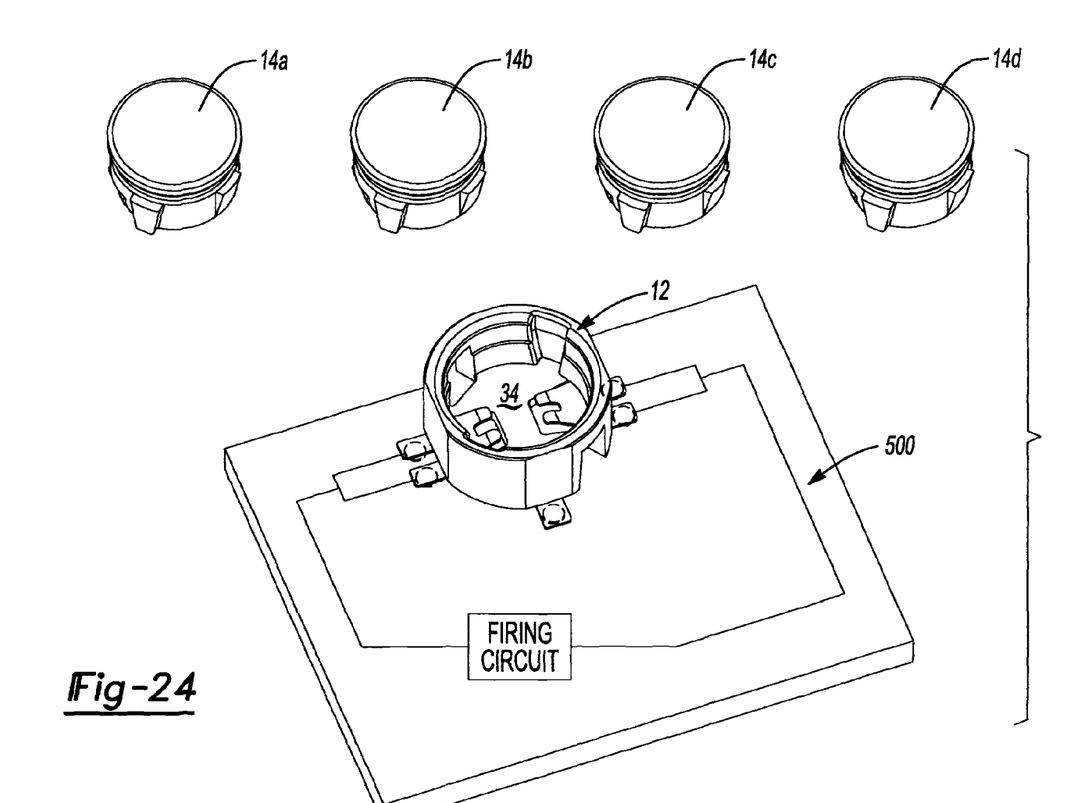
FIG. 24 is a perspective view of a plurality of different initiator assemblies as exploded from an assembly that comprises the receiver assembly and a firing circuit.

With reference to FIG. 24, it will be appreciated that quantities of an assembly comprising the firing circuit 500 and the receiver assembly 12 can be pre-assembled (only one such assembly is shown) and that quantities of various types of initiator assemblies 14a, 14b, 14c and 14d can be pre-assembled. In the example provided, each of the initiator assemblies 14a, 14b, 14c and 14d is configured differently. For example, one or more of the initiator assemblies 14a, 14b, 14c and 14d can employ a different electronic initiator and/or can be configured to provide a different output. Where different electronic initiators are employed, it will be appreciated from this disclosure that the electronic initiators may be of different types, such as exploding foil initiator and exploding bridge wire initiators, or could be the same type of initiator, such as an exploding foil initiator, but configured to be triggered in a different manner (e.g., with a different voltage or switch configuration). Where different outputs are employed, it will be appreciated from this disclosure that the difference in output could be one of magnitude only, but also could be different in terms of the speed of the reaction that generates the output (e.g., one type of output could be the products of a detonation event, while another type of output could be the products of a combustion event). Accordingly, one may arm a given one of the assemblies (i.e., an assembly comprising the firing circuit 500 and the receiver assembly 12) by first selecting one of the several initiator assemblies 14a, 14b, 14c and 14d and inserting the selected one of the initiator assemblies 14a, 14b, 14c and 14d into the socket 34 of the receiver assembly 12 of the given one of the assemblies.

It will be appreciated that the above description is merely exemplary in nature and is not intended to limit the present disclosure, its application or uses. While specific examples have been described in the specification and illustrated in the drawings, it will be understood by those of ordinary skill in the art that various changes may be made and equivalents may be substituted for elements thereof without departing from the scope of the present disclosure as defined in the claims. Furthermore, the mixing and matching of features, elements and/or functions between various examples is expressly contemplated herein so that one of ordinary skill in the art would appreciate from this disclosure that features, elements and/or functions of one example may be incorporated into another example as appropriate, unless described otherwise, above. Moreover, many modifications may be made to adapt a particular situation or material to the teachings of the present disclosure without departing from the essential scope thereof. Therefore, it is intended that the present disclosure not be limited to the particular examples illustrated by the drawings and described in the specification as the best mode presently contemplated for carrying out the teachings of the present disclosure, but that the scope of the present disclosure will include any embodiments falling within the foregoing description and the appended claims.

What is claimed is:

1. A method for mounting an energetic material initiation device to a firing circuit, the firing circuit including a circuit board, the method comprising:
providing a receiver assembly with a receiver, and a plurality of receiver terminals, the receiver including a base and an upstanding wall member, the base and the upstanding wall member cooperating to form a socket, the upstanding wall member defining a first insertion guide and a first locking member, the receiver terminals extending through at least one of the base and the upstanding wall member;
providing an initiator assembly with an initiator housing, an electronic initiator, a pellet assembly and a plurality of initiator terminals, the initiator housing defining a recess into which the pellet assembly is received, the initiator housing including a second insertion guide and a second locking member, the electronic initiator being at least partially encapsulated into the initiator housing, the initiator terminals being electrically coupled to the electronic initiator and extending through the initiator housing, the pellet assembly including an energetic material;

electrically coupling the receiver terminals to corresponding arming terminals on the circuit board when the pellet assembly is not disposed in the socket;

aligning the initiator assembly to the socket such that the first and second insertion guides are engaged to one another; and electrically coupling the electronic initiator to the arming terminals solely by pushing the initiator assembly into the socket such that the first and second locking members are lockingly engaged to one another and the initiator terminals are electrically engaged to the receiver terminals.

2. The method of claim 1, wherein the initiator assembly is precisely aligned to the receiver assembly in a radial direction when the initiator assembly is pushed into the socket.

3. The method of claim 2, wherein one of the first and second insertion guides includes a groove having sidewalls, at least a portion of the sidewalls tapering inwardly toward one another.

4. The method of claim 3, wherein the other one of the first and second insertion guides includes a rib with lateral sides, and wherein at least a portion of the lateral sides are inwardly tapered to match the inwardly tapered portion of the sidewalls of the groove.

5. The method of claim 1, wherein the receiver further comprises a locating element and prior to electrically coupling the receiver terminals to the corresponding arming terminals the method comprises engaging the locating element to a mating locating element on the circuit board to precisely locate the receiver assembly on the circuit board.

6. The method of claim 5, wherein one of the locating element and the mating element includes a stem and the other one of the locating element and the mating element includes an aperture into which the stem is received.

7. The method of claim 1, wherein electrically coupling the receiver terminals to the corresponding arming terminals comprises soldering an end of the receiver terminals that is located outside the socket to the corresponding arming terminals.

8. The method of claim 1, wherein the initiator assembly further comprises a cover member that is directly coupled to the initiator housing.

9. The method of claim 8, wherein the cover member is crimped to a flange that extends about the initiator housing.

10. The method of claim 1, wherein the receiver terminals bias the initiator assembly in a direction outwardly from the receiver housing.

11. An energetic material initiation device comprising:
a receiver assembly with a receiver and a plurality of receiver terminals, the receiver including a base and an upstanding wall member, the base and the upstanding wall member cooperating to form a socket, the upstanding wall member defining a first insertion guide and a first locking member, the receiver terminals extending through at least one of the base and the upstanding wall member; and an initiator assembly received in the socket, the initiator assembly including an initiator housing, an electronic initiator, a pellet assembly and a plurality of initiator terminals, the initiator housing defining a recess into which the pellet assembly is received, the initiator housing including a second insertion guide and a second locking member, the electronic initiator being at least partially encapsulated into the initiator housing, the initiator terminals being electrically coupled to the electronic initiator and extending through the initiator housing, the pellet assembly including an energetic material;

wherein the first and second insertion guides are engaged to one another to align the initiator assembly to the socket;

wherein the first and second locking members engage one another to inhibit the initiator assembly from being withdrawn from the socket; and wherein the receiver terminals resiliently engage the initiator terminals to electrically couple the electronic initiator and the receiver terminals.

12. The energetic material initiation device of claim 11, wherein one of the first and second locking members includes an outer longitudinal wall and a first abutting wall, the outer longitudinal wall extending in a direction that is parallel to a central axis of the socket and tapering inwardly toward the central axis, the abutting wall extending in a direction that is generally perpendicular to the central axis of the socket, and wherein the other one of the first and second locking members includes a second abutting wall that abuts the first abutting wall when the first and second locking members are engaged to one another.

13. The energetic material initiation device of claim 11, wherein the first and second insertion guides precisely align the initiator assembly to the receiver assembly when the initiator assembly is pushed into the socket.

14. The energetic material initiation device of claim 13, wherein one of the first and second insertion guides includes a groove having sidewalls, at least a portion of the sidewalls tapering inwardly toward one another.

15. The energetic material initiation device of claim 14, wherein the other one of the first and second insertion guides includes a rib with lateral sides, and wherein at least a portion of the lateral sides are inwardly tapered to match the inwardly tapered portion of the sidewalls of the groove.

16. The energetic material initiation device of claim 11, wherein the receiver further comprises a locating element that is adapted to cooperate with a mating locating element on a circuit board associated with a firing circuit to radially locate the receiver assembly relative to the circuit board.

17. The energetic material initiation device of claim 16, wherein the locating element is a stem that extends from the base of the receiver.

18. The energetic material initiation device of claim 11, wherein the initiator assembly further comprises a cover member that is directly coupled to the initiator housing.

19. The energetic material initiation device of claim 18, wherein the cover member is crimped to a flange that extends about the initiator housing.

20. A method for mounting an energetic material initiation device to a firing circuit, the firing circuit including a circuit board, the method comprising:

providing a receiver assembly with a receiver, and a plurality of receiver terminals, the receiver including a base and an upstanding wall member, the base and the upstanding wall member cooperating to form a socket, the upstanding wall member defining a first insertion guide and a first locking member, the receiver terminals extending through at least one of the base and the upstanding wall member;

engaging a locating element on the receiver to a mating locating element on the circuit board to precisely locate the receiver assembly on the circuit board, the locating element including a stem that is coupled to the base of the receiver and the mating locating element comprising an aperture that is formed in the circuit board;

providing an initiator assembly with an initiator housing, an electronic initiator, a pellet assembly, a cover and a plurality of initiator terminals, the initiator housing defining a recess into which the pellet assembly is received, the initiator housing including a second insertion guide and a second locking member, the electronic initiator being at least partially encapsulated into the initiator housing, the cover being crimped to a flange that extends about the initiator housing to thereby directly couple the cover and the initiator housing, the initiator terminals being electrically coupled to the electronic initiator and extending through the initiator housing, the pellet assembly including an energetic material;

soldering an end of the receiver terminals that is located outside the socket to the corresponding arming terminals to electrically couple the receiver terminals to corresponding arming terminals on the circuit board when the pellet assembly is not disposed in the socket;

aligning the initiator assembly to the socket such that the first and second insertion guides are engaged to one another; and electrically coupling the electronic initiator to the arming terminals solely by pushing the initiator assembly into the socket such that the first and second locking members are lockingly engaged to one another and the initiator terminals are electrically engaged to the receiver terminals;

wherein one of the first and second insertion guides includes a groove having sidewalls, at least a portion of the sidewalls tapering inwardly toward one another, wherein the other one of the first and second insertion guides includes a rib with lateral sides, and wherein at least a portion of the lateral sides are inwardly tapered to match the inwardly tapered portion of the sidewalls of the groove and wherein the initiator assembly is precisely aligned to the receiver assembly in a radial direction when the initiator assembly is pushed into the socket; and wherein the receiver terminals bias the initiator assembly in a direction outwardly from the receiver housing.

\* \* \* \* \*